US012656378B2

(12) United States Patent
Venca

(10) Patent No.: US 12,656,378 B2
(45) Date of Patent: Jun. 16, 2026

(54) POWER DETECTOR

(71) Applicant: STMicroelectronics International N.V., Geneva (CH)

(72) Inventor: Alessandro Venca, Hauterive (CH)

(73) Assignee: STMicroelectronics International N.V., Geneva (CH)

( * ) Notice: Subject to any disclaimer, the term of this patent is extended or adjusted under 35 U.S.C. 154(b) by 257 days.

(21) Appl. No.: 18/541,617

(22) Filed: Dec. 15, 2023

(65) Prior Publication Data

US 2024/0219439 A1 Jul. 4, 2024

(30) Foreign Application Priority Data

Dec. 22, 2022 (FR) ...................................... 2214192

(51) Int. Cl.
*G01R 19/02* (2006.01)
*G01R 21/00* (2006.01)

(52) U.S. Cl.
CPC ............. *G01R 19/02* (2013.01); *G01R 21/00* (2013.01)

(58) Field of Classification Search
CPC ......... G01R 19/02; G01R 21/00; G01R 21/10
USPC .......................................................... 327/348
See application file for complete search history.

(56) References Cited

U.S. PATENT DOCUMENTS

| | | | |
|---|---|---|---|
| 10,164,593 B1 | 12/2018 | Harwalkar et al. | |
| 2009/0237068 A1* | 9/2009 | Vora ........................ | G01R 21/10 |
| | | | 327/349 |
| 2012/0235733 A1 | 9/2012 | Nakamoto | |
| 2012/0274302 A1 | 11/2012 | Vora | |
| 2021/0003613 A1 | 1/2021 | Fuhrmann et al. | |
| 2022/0303027 A1 | 9/2022 | Shah | |

OTHER PUBLICATIONS

INPI Search Report and Written Opinion for priority application, FR Appl. 2214192, report dated Jul. 17, 2023, 9 pgs.

* cited by examiner

*Primary Examiner* — William Hernandez
(74) *Attorney, Agent, or Firm* — Crowe & Dunlevy LLC

(57) ABSTRACT

A power detector for detecting the RMS power of an AC voltage includes a transconductor configured to receive the AC voltage and to provide a first current to a node with a non-linear relation between the first current and the voltage. A current output digital to analog converter is configured to receive a digital signal and to provide a second current to the node. A low pass filter is coupled to the node, and an inverter is coupled to the node and configured to provide a binary signal.

15 Claims, 3 Drawing Sheets

POWER DETECTOR

PRIORITY CLAIM

This application claims the priority benefit of French patent application number 2214192, filed on Dec. 21, 2022, which is hereby incorporated by reference to the maximum extent allowable by law.

TECHNICAL FIELD

The present disclosure concerns a power detector for determining the power of an alternating current (AC) signal.

BACKGROUND

Root mean square (RMS) power detectors are based on average power measurement, and are particularly suited for making accurate power measurements of radiofrequency modulated signals that exhibit high peak-to-average ratio or noise-like properties.

An RMS power detector can for example be used in a radiofrequency receiver comprising amplifiers and an automatic gain control circuit that can control the gains of the amplifiers based on the RMS power measured by the RMS power detector. A drawback of an RMS power detector is that it may have excessive power consumption. Another drawback of an RMS power detector is that it can have a low sensitivity.

There is a need in the art to provide an RMS power detector overcoming all or part of the disadvantages of existing RMS power detectors.

There is a need in the art for an RMS power detector having a reduced power consumption.

There is a need in the art for an RMS power detector having an enhanced sensitivity.

SUMMARY

One embodiment provides a power detector for detecting the RMS power of an Ac voltage, including a transconductor configured to receive the voltage and to provide a first current to a node with a non-linear relation between the first current and the voltage, a current output digital to analog converter configured to receive a digital signal and to provide a second current to the node, a low pass filter coupled to the node, and an inverter coupled to the node and configured to provide a binary signal.

According to an embodiment, the transconductor may be a first MOS transistor.

According to an embodiment, the low pass filter may include a first capacitor having an electrode coupled to the node.

According to an embodiment, the current output digital to analog converter may include second MOS transistors and controllable switches, each second MOS transistor being in series with one of the controllable switches, each controllable switch being controlled by one bit of the digital signal.

According to an embodiment, the power detector may include a current source configured to provide a constant reference current and first current mirrors configured to copy the constant reference current multiplied by different multiplying factors, each first current mirror comprising one of the second MOS transistors.

According to an embodiment, the power detector may include a diode mounted third MOS transistor, the gate of the third MOS transistor being coupled to the gate of the first MOS transistor via a resistor and a second current mirror configured to copy the constant reference current to supply the third MOS transistor.

One embodiment also provides an electronic circuit that may include the power detector previously described and an electronic unit configured to receive the binary signal and to vary the digital signal until a toggling of the binary signal.

According to an embodiment, the electronic circuit may be a radiofrequency receiver or a radiofrequency emitter.

According to an embodiment, the electronic circuit may include an amplifier configured to receive a radiofrequency ac voltage and to amplify the radiofrequency ac voltage, the amplifier being a transconductance amplifier comprising a fourth MOS transistor, and the first MOS transistor is a scale replica of the fourth MOS transistor.

One embodiment also provides a method for determining the RMS power of an ac voltage using the power detector previously described, potentially including varying the digital signal until the toggling of the binary signal.

According to an embodiment, the method may also include setting the AC voltage at a constant value, and varying the digital signal until the toggling of the binary signal and storing the digital signal for which the binary signal has toggled.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional, and material properties. For the sake of clarity, only the steps and elements that are useful for an understanding of the embodiments described herein have been illustrated and described in detail.

Unless indicated otherwise, when reference is made to two elements connected together, this signifies a direct electrical connection without any intermediate elements other than conductors, and when reference is made to two elements coupled together, this signifies that these two elements can be connected, or that they can be coupled via one or more other elements. Further, a signal which alternates between a first constant state, for example, a low state, noted "0", and a second constant state, for example, a high state, noted "1", is called a "binary signal". The high and low states of different binary signals of a same electronic circuit may be different. In practice, the binary signals may correspond to voltages or to currents which may not be perfectly constant in the high or low state.

Unless specified otherwise, the expressions "around", "approximately", "substantially" and "in the order of" signify within 10%, and preferably within 5%. Further the expression "substantially constant" means which varies by less than 10% over time with respect to a reference value.

The RMS value of an AC signal is defined as the amount of DC signal required to produce an equivalent amount of heat in the same load. Therefore, the RMS voltage $V_{rms}$ of an AC voltage V is given by the following relation:

$$V_{rms} = \sqrt{avg[V^2(t)]} \tag{1}$$

The power P(dBm) of an AC signal V, expressed in dBm, is given by the following relation:

$$P(dBm) = 10\log_{10}\left(\frac{\frac{V_{rms}^2}{50}}{1 \text{ mW}}\right) = 10\log_{10}\left(\frac{\frac{avg[V_{(t)}^2]}{50}}{1 \text{ mW}}\right) \tag{2}$$

According to an embodiment, the RMS power detector comprises, in order to realize the power detection of the input AC voltage, a transconductor receiving the input AC voltage and providing an output current and having a non-linear characteristic between the output current and the input voltage. The transconductor can be a metal-oxide-semiconductor field-effect transistor, called MOS transistor hereafter.

Figure 1:
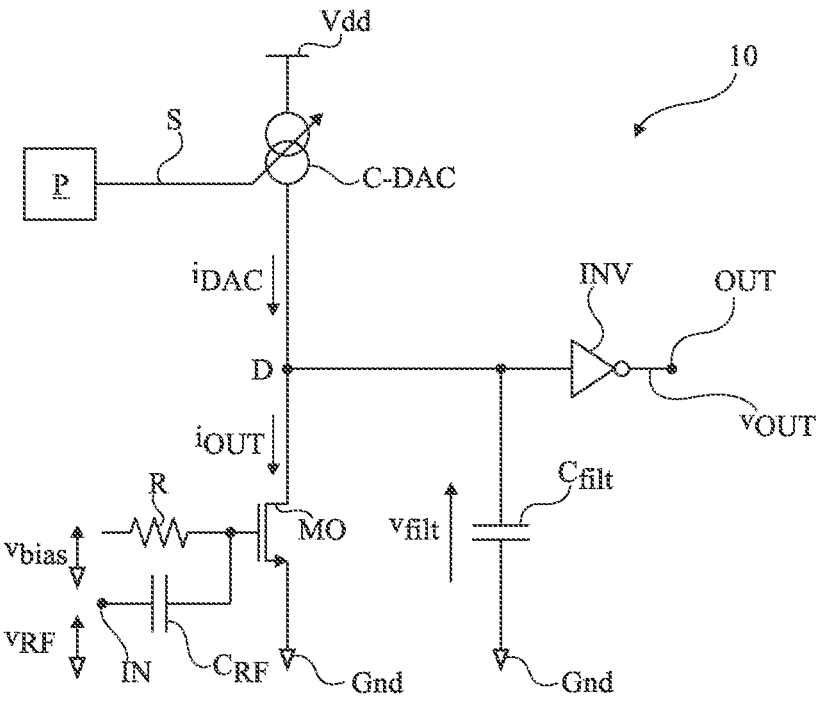
FIG. 1 partially and schematically shows an embodiment of a power detector.

FIG. 1 partially and schematically shows an embodiment of a power detector 10 configured to determine the RMS power of a signal $V_{RF}$, for example a radiofrequency AC voltage. Power detector 10 is coupled between a source of a high reference potential Vdd and a source of a low reference potential Gnd, for example the ground taken equal to 0V.

Power detector 10 comprises: an input IN receiving voltage $V_{RF}$; an output OUT providing a binary voltage $v_{OUT}$; a MOS transistor M0, for example an N-channel MOS transistor, the source of transistor M0 being coupled to or connected to the source of the low reference potential Gnd, the drain of transistor M0 being coupled or connected, to a node D; a current output Digital to Analog converter C-DAC controlled by a digital control signal S and coupled or connected, between node D and the source of the high reference potential Vdd; a resistor R coupled or connected, between the gate of transistor M0 and a source of a biasing voltage $v_{bias}$; a first capacitor $C_{RF}$ coupled or connected, between input IN and the gate of transistor M0; a second capacitor $C_{filt}$ coupled or connected, between node D and the source of the low reference potential Gnd; and an inverter INV, the input of inverter INV being coupled or connected, to node D, and the output of inverter INV being coupled or connected to output OUT.

Power detector 10 is controlled by a control electronic circuit P, for example a microcontroller, receiving binary voltage $v_{OUT}$ and providing control signal S.

The operation of detector 10 is now described. The converter C-DAC provides a current $i_{DAC}$ at node D that depends on control signal S. Control signal S is a digital signal having N+1 bits $S_0$ to $S_N$, N being an integer for example greater than or equal to 3. Bit $S_0$ is for example the least significant bit of control signal S. The current at the drain of transistor M0 is denoted as İOUT and the gate-source voltage of transistor M0 is denoted as led $V_{gs}$. The first derivative of current jour with respect to voltage $V_{gs}$ is denoted as gm and the second derivative of current $i_{OUT}$ with respect to voltage $V_{gs}$ is denoted as gm'. When voltage $V_{RF}$ is equal to 0V, current $i_{OUT}$ is equal to a constant current $i_{bias}$. The voltage across capacitor $C_{filt}$ is called $v_{filt}$.

Without taking into account the filtering action of capacitor $C_{filt}$, current $i_{OUT}$ is given by the following relation, neglecting the terms higher than the second order terms:

$$i_{OUT} = i_{bias} + gm \cdot v_{RF} + gm' \cdot v_{RF}^2 \tag{3}$$

When voltage $V_{RF}$ is a sinusoidal voltage with a pulsation ω and an maximum amplitude $V_{RF}$, input voltage $V_{RF}$ is given by equation:

$$v_{RF} = V_{RF} \cdot \cos(\omega t) \tag{4}$$

Equation 3 then becomes:

$$i_{OUT} = i_{bias} + gm \cdot V_{RF} \cdot \cos(\omega t) + gm' \cdot V_{RF}^2 \cdot (\cos(\omega t))^2 \tag{5}$$

Current $i_{OUT}$ is averaged by the filtering action of capacitor $C_{filt}$, so that actual current $i_{OUT}$ is given by the following equation:

$$i_{OUT} = i_{bias} + \frac{1}{2} gm' \cdot V_{RF}^2 \tag{6}$$

In Equation 6 of current $i_{OUT}$, the second term is proportional to the RMS power of voltage $v_{RF}$. Detector 10 senses the DC amplitude of the second order distortion product generated by the non-linear characteristics of MOS transistor M0 by comparing current jour with current $i_{DAC}$ generated by converter C-DAC and by detecting when current $i_{DAC}$ is equal current $i_{OUT}$.

According to an embodiment, converter C-DAC is controlled so that current $i_{DAC}$ is increased from a 0 A. Therefore, initially current $i_{DAC}$ is inferior to the maximum current jour than can be conducted by transistor M0. Voltage $v_{filt}$ is therefore substantially at the low reference voltage Gnd. Voltage $v_{OUT}$ is at logical value "1". Control S is modified to increase current $i_{DAC}$. As soon as current $i_{DAC}$ becomes superior to the maximum current $i_{OUT}$ than can be conducted by transistor M0, voltage $v_{filt}$ is driven by transistor M0 and increases to be substantially equal to the high reference voltage Vdd minus the voltage across the converter C-DAC and is superior to the threshold of inverter INV. Voltage $v_{filt}$ therefore decreases instantly above the threshold of inverter INV so that voltage $v_{OUT}$ is at a low logical value "0". Therefore, voltage $v_{OUT}$ toggles from a high logical value "1" to a low logical value "0" when current $i_{DAC}$ is equal to current $i_{OUT}$. The toggling of voltage $v_{OUT}$ is detected by control circuit P and the value $S_{tog}$ of control signal S for which voltage $v_{OUT}$ toggles from a high logical value "1" to a low logical value "0" is stored.

Since current $i_{bias}$ is known, the second term of Equation 6 can be determined.

Detector 10 compares in a single branch the drain current $i_{OUT}$ of transistor M0 with a calibrated current $i_{DAC}$ by using voltage $V_{filt}$ at node D that is a high-gain rail-to-rail node, so that the comparison can be performed by a simple inverter INV.

Transistor M0 can controlled in the active region, the triode region, or the weak inversion region. In the active region and the triode region, the relationship $i_{ds}/v_{gs}$ is quadratic, with $i_{ds}$ being the drain to source current and $v_{gs}$ being the gate to source voltage. In the weak inversion region, the relationship $i_{ds}/v_{gs}$ is exponential. In the active region, the triode region, or the weak inversion region, current $i_{OUT}$ carries a term linearly proportional to the RF RMS input power, so that the detection method previously described can be implemented.

Due to the mismatch of the components of detector 10, there may be an extra DC term $i_{off}$ that appears in the Equation 6 of current $i_{OUT}$, which becomes the following:

$$i_{OUT} = i_{bias} + \frac{1}{2} gm' \cdot V_{RF}^2 + i_{off} \qquad (7)$$

Figure 2:
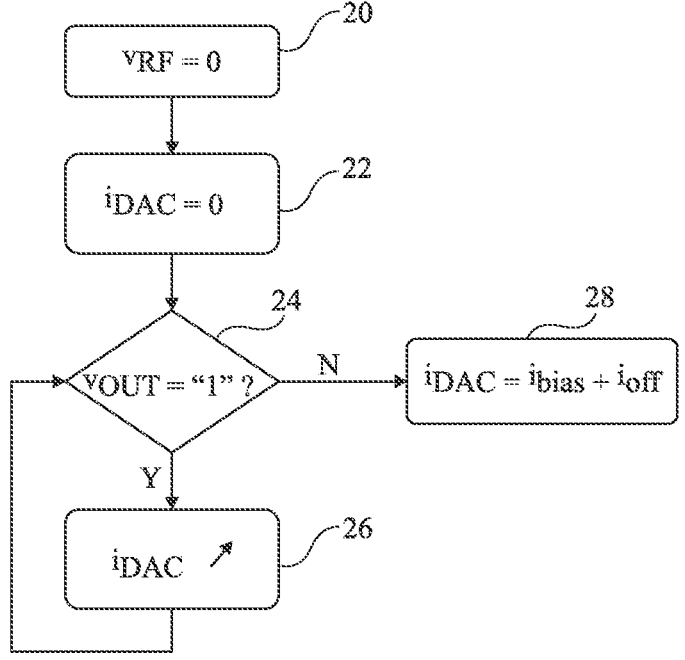
FIG. 2 is a block diagram of an embodiment of a method for calibrating the power detector shown in FIG. 1.

FIG. 2 is a block diagram illustrating an embodiment of a calibration method of detector 10 to take into account the extra term $i_{off}$.

At step 20, voltage $v_{RF}$ is set to 0V.

At step 22, converter C-DAC is controlled so that current $i_{DAC}$ is equal to 0A.

At step 24, voltage $v_{OUT}$ is observed. In case voltage $v_{OUT}$ is equal to high logical value "1" (Y), the method goes on to step 26. In case voltage $v_{OUT}$ is equal to low logical value "0" (N), the method continues at step 28.

At step 26, control signal S is increased, for example, by one bit. This leads to an increase of current $i_{DAC}$. The method goes back at step 24 in which voltage $v_{OUT}$ is observed.

At step 28, the toggling of voltage $v_{OUT}$ is detected by control circuit P and the value $S_{off}$ of control value S is stored. Since voltage $v_{OUT}$ has just toggled from high logical value "1" to low logical value "0", current $i_{DAC}$ corresponding to stored control value $S_{off}$ is equal to the sum of $i_{bias}$ and $i_{off}$.

According to another embodiment, the determination of value $S_{off}$ of control signal S can be made by a dichotomy algorithm.

When value $S_{tog}$ of control signal S for which voltage $v_{OUT}$ toggles from a high logical value "1" to a low logical value "0" is detected, the difference between values $S_{tog}$ and $S_{off}$ can be determined.

The method for determining control value $S_{off}$ can be implemented at the startup of the electronic device comprising detector 10. Values $S_{off}$ and $S_{tog}$ of control signal S can be used to determine the second term of Equation 6 that is proportional to the RMS power of voltage $V_{RF}$.

The previously described method for determining control value $S_{off}$ advantageously does not require additional analog hardware to be implemented. Moreover, it advantageously does not require voltage $v_{RF}$.

Figure 3:
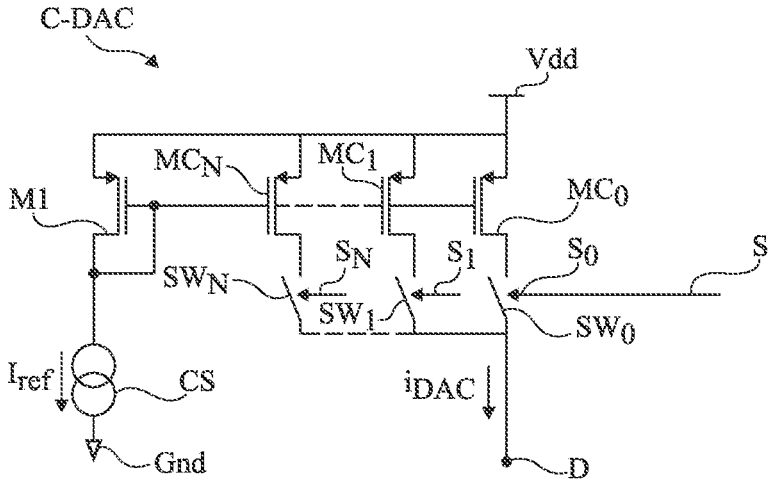
FIG. 3 partially and schematically shows an embodiment of a current output Digital to Analog converter.

FIG. 3 shows an embodiment of current output Digital to Analog converter C-DAC.

Current output Digital to Analog converter C-DAC comprises: a current source CS providing a constant current $I_{ref}$ and having a first terminal coupled or connected to the source of the low reference potential Gnd; a MOS transistor M1, for an example a P channel MOS transistor, the source of transistor M1 being coupled or connected to the source of the high reference potential Vdd, the drain of transistor M1 being coupled or connected, to a second terminal of current source CS, and the gate of transistor M1 being coupled or connected, to the second terminal of current source CS; N+1 MOS transistors $MC_i$, i being a integer varying from 0 to N, each transistor $MC_i$ being for example a P channel MOS transistor, the source of transistor $MC_i$ being coupled or connected to the source of the high reference potential Vdd, and the gate of transistor $MC_i$ being coupled or connected, to the gate of transistor M1; and N+1 controllable switches $SW_i$, i being a integer varying from 0 to N, each switch $SW_i$ having a first terminal coupled or connected to the drain of transistor $MC_i$ and a second terminal coupled or connected to node D, each switch $SW_i$ being controlled by bit $S_i$ of control signal S.

Each transistor $MC_i$ has a size factor with respect to transistor M1 equal to $2^i$. This means that transistor $MC_0$ has the same size as transistor M1 and that transistor $MC_N$ is $2^N$ times bigger than transistor M1. Each transistor $MC_i$ forms a current mirror with transistor M1 and reproduces current $I_{ref}$ multiplied by a factor equal to $2^i$.

In an embodiment, switch $SW_i$ is closed when bit $S_i$ is at a high logical value "1" and is open when bit $S_i$ is at a low logical value "0". For example, switch $SW_i$ is a MOS transistor, for an example an N channel MOS transistor, the drain of the transistor being coupled or connected to the drain of transistor $MC_i$, the source of the transistor being coupled or connected to node D, and the gate of the transistor receiving bit $S_i$.

Figure 4:
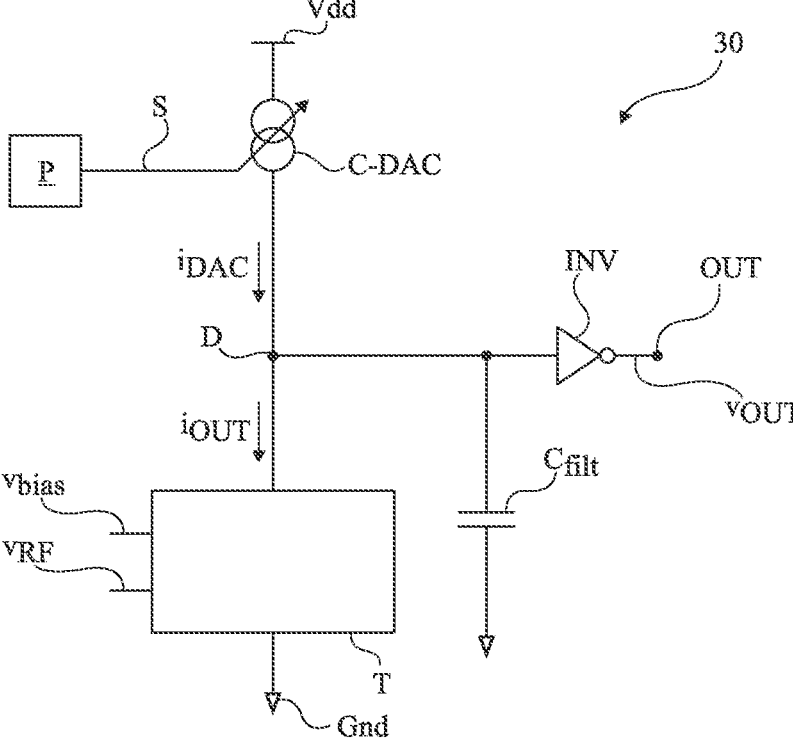
FIG. 4 partially and schematically shows another embodiment of a power detector.

FIG. 4 partially and schematically shows another embodiment of a power detector 30. Power detector 30 shown in FIG. 4 comprises all the elements of power detector 10 shown in FIG. 1 except that transistor M0 is replaced by a transconductor T receiving input voltage $V_{RF}$, and possibly biasing voltage $v_{bias}$, and providing current $i_{OUT}$. Transconductor has a non-linear relation between current jour and input voltage $v_{RF}$. For example, transconductor T comprises a bipolar junction transistor.

Figure 5:
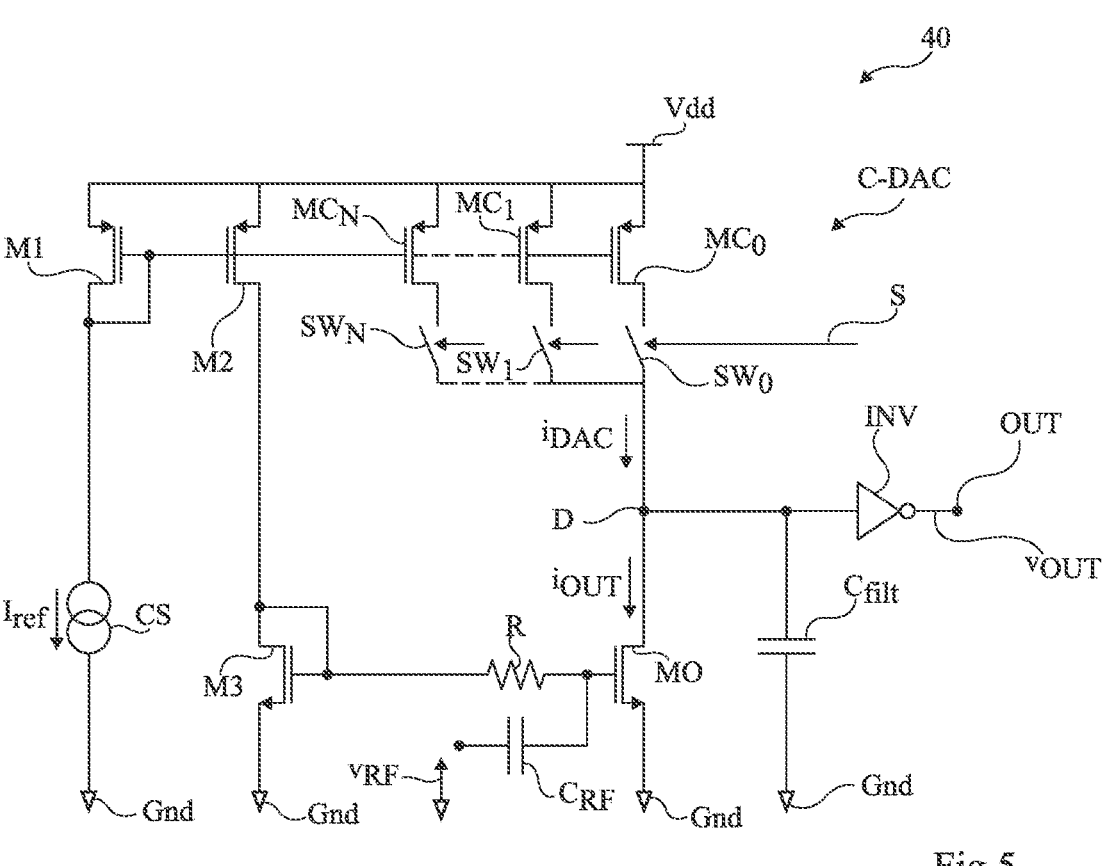
FIG. 5 partially and schematically shows another embodiment of a power detector.

FIG. 5 partially and schematically shows another embodiment of a power detector 40. Power detector 40 shown in FIG. 5 comprises all the elements of power detector 10 with converter C-DAC having the structure shown in FIG. 3. Power detector 40 further comprises: a transistor MOS M2, for example a P channel MOS transistor, the source of transistor M2 being coupled or connected to the source of the high reference potential Vdd, and the gate of transistor M2 being coupled or connected, to the gate of transistor M1; and a transistor MOS M3, for example a N channel MOS transistor, the source of transistor M3 being coupled or connected to the source of the low reference potential Gnd, the gate of transistor M3 being coupled or connected to resistor R and the drain of transistor M3 being coupled or connected to the drain of transistor M2 and to the gate of transistor M3.

In the embodiment shown in FIG. 5, the same current source CS is used to bias the converter C-DAC and to bias transistor M0 . This allows advantageously tracking of offset variations that depend on temperature.

An application of a power detector concerns a radiofrequency receiver or a radiofrequency emitter.

Figure 6:
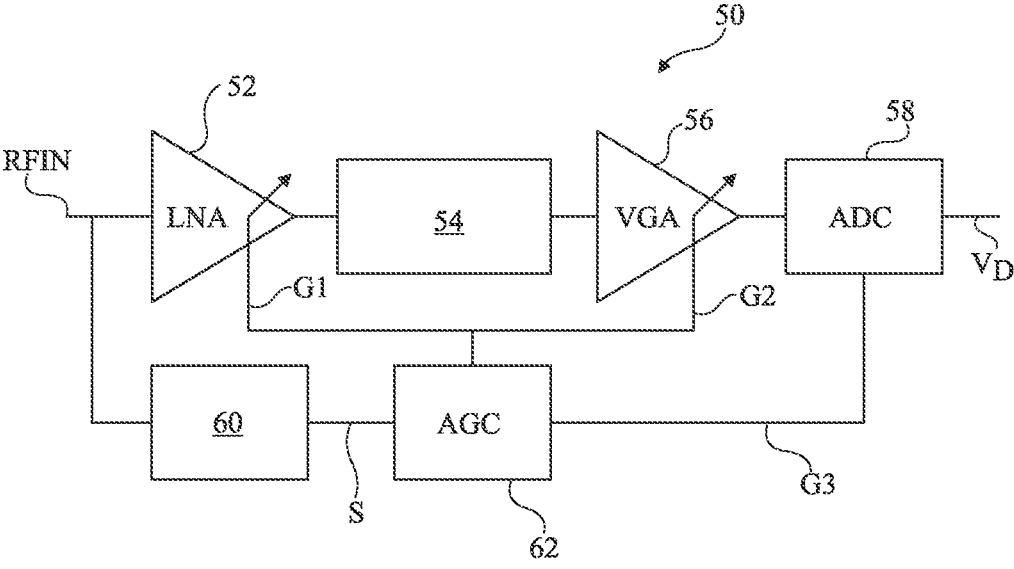
FIG. 6 partially and schematically shows an embodiment of a radiofrequency receiver circuit.

FIG. 6 is a schematic bloc diagram of a radiofrequency receiver 50 receiving ac voltage RFIN that can correspond to an ac voltage obtained from an antenna.

Receiver 50 comprises: a low noise amplifier 52 (LNA) receiving voltage RFIN and amplifying voltage RFIN; a down-conversion unit 54 that receives the amplified voltage provided by low noise amplifier 52 and that converts it down to the baseband frequency; a variable gain amplifier 56 (VGA) that amplifies the down-converted signal; an Analog to Digital converter 58 (ADC) that converts the down-converted and amplified signal into a digital signal $V_D$; a power detector 60, that corresponds to any of power detectors 10, 30 or 40, receiving voltage RFIN and providing digital control values $S_{off}$ and $S_{tog}$ of control signal S upon the detection of the RMS power of voltage RFIN; and an automatic gain control circuit 62 (AGC), that can correspond to the control circuit P previously described, that sends control signal S to power detector 60, and that sends gain control signals G1, G2, G3 to low noise amplifier 52, variable gain amplifier 56, and/or Analog to Digital converter 58, that depend on the detected RMS power of voltage RFIN.

As a variation, instead of determining the RMS power of voltage RFIN power detector 60 can determine the RMS power of the amplified voltage provided by low noise amplifier 52.

According to an embodiment, low noise amplifier 52 comprises at least one MOS transistor.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

The invention claimed is:

1. An electronic circuit including a power detector for detecting RMS power of an AC voltage, the power detector comprising:
   a transconductor configured to receive the AC voltage and to provide a first current to a node with a non-linear relation between the first current and the AC voltage;
   a current output digital to analog converter configured to receive a digital signal and to provide a second current to the node;
   a low pass filter coupled to the node; and
   an inverter having an input coupled to the node and an output configured to provide a binary signal.

2. The electronic circuit according to claim 1, wherein the low pass filter comprises a first capacitor having an electrode coupled to the node.

3. The electronic circuit according to claim 2, wherein the transconductor comprises a first MOS transistor; and wherein the first MOS transistor is an n-channel transistor having a drain connected to the node, a source connected to ground, and a gate coupled to the AC voltage.

4. The electronic circuit according to claim 3, wherein the gate of the first MOS transistor is capacitively coupled to the AC voltage through a capacitor, and is also coupled to receive a bias voltage.

5. The electronic circuit according to claim 1, wherein the transconductor comprises a first MOS transistor.

6. The electronic circuit according to claim 5, wherein the current output digital to analog converter comprises second MOS transistors and controllable switches, each second MOS transistor being coupled in series with one of the controllable switches, each controllable switch being controlled by one bit of the digital signal.

7. The electronic circuit according to claim 6, wherein the current output digital to analog converter further comprises a current source configured to provide a constant reference current and first current mirrors configured to copy the constant reference current multiplied by different multiplying factors to thereby generate the second current, each first current mirror comprising one of the second MOS transistors.

8. The electronic circuit according to claim 7, further comprising a diode mounted third MOS transistor, wherein a gate of the diode mounted third MOS transistor is coupled to a gate of the first MOS transistor via a resistor and a second current mirror configured to copy the constant reference current to supply the diode mounted third MOS transistor.

9. The electronic circuit according to claim 1, further comprising an electronic unit configured to receive the binary signal and to vary the digital signal until a toggling of the binary signal occurs.

10. The electronic circuit according to claim 9, wherein the electronic circuit is configured to define a radiofrequency receiver.

11. The electronic circuit according to claim 10, wherein the transconductor comprises a first MOS transistor; and further comprising an amplifier configured to receive a radiofrequency AC voltage and to amplify the radiofrequency AC voltage, wherein the amplifier is a transconductance amplifier comprising a fourth MOS transistor, and wherein the first MOS transistor is a scale replica of the fourth MOS transistor.

12. The electronic circuit according to claim 9, wherein the electronic circuit is configured to define a radiofrequency emitter.

13. The electronic circuit according to claim 12, wherein the transconductor comprises a first MOS transistor; and further comprising an amplifier configured to receive a radiofrequency AC voltage and to amplify the radiofrequency AC voltage, wherein the amplifier is a transconductance amplifier comprising a fourth MOS transistor, and wherein the first MOS transistor is a scale replica of the fourth MOS transistor.

14. A method for determining RMS power of an AC voltage using a power detector, the method comprising:
   receiving the AC voltage and providing a first current to a node with a non-linear relation between the first current and the AC voltage, using a transconductor;
   receiving a digital signal at a current output digital to analog converter and providing a second current to the node;
   low-pass filtering the node;
   inverting a voltage at the node to produce a binary signal; and
   varying the digital signal until toggling of the binary signal occurs.

15. The method according to claim 14, further comprising setting the AC voltage at a constant value, varying the digital signal until the toggling of the binary signal occurs, and storing the digital signal for which the binary signal has toggled.

* * * * *